(12) United States Patent
Liao et al.

(10) Patent No.: US 10,158,014 B2
(45) Date of Patent: Dec. 18, 2018

(54) MOS DEVICES WITH ULTRA-HIGH DIELECTRIC CONSTANTS AND METHODS OF FORMING THE SAME

(71) Applicants: Taiwan Semiconductor Manufacturing Company, Ltd., Hsinchu (TW); National Taiwan University, Taipei (TW)

(72) Inventors: Ming-Han Liao, Hsinchu (TW); Minghwei Hong, Zhubei (TW)

(73) Assignees: Taiwan Semiconductor Manufacturing Company, Ltd., Hsinchu (TW); National Taiwan University, Taipei (TW)

( * ) Notice: Subject to any disclaimer, the term of this patent is extended or adjusted under 35 U.S.C. 154(b) by 23 days.

(21) Appl. No.: 15/477,164

(22) Filed: Apr. 3, 2017

(65) Prior Publication Data
US 2017/0207094 A1 Jul. 20, 2017

Related U.S. Application Data

(62) Division of application No. 14/245,785, filed on Apr. 4, 2014, now Pat. No. 9,614,079.

(51) Int. Cl.
*H01L 21/00* (2006.01)
*H01L 29/78* (2006.01)
(Continued)

(52) U.S. Cl.
CPC ...... *H01L 29/78391* (2014.09); *C23C 14/165* (2013.01); *H01L 21/28194* (2013.01); *H01L 27/088* (2013.01); *H01L 29/165* (2013.01); *H01L 29/401* (2013.01); *H01L 29/4966* (2013.01); *H01L 29/516* (2013.01);
(Continued)

(58) Field of Classification Search
CPC .......... H05B 2203/023; H01B 11/1083; H01F 41/16; H01F 41/32; H01H 2050/365
See application file for complete search history.

(56) References Cited

U.S. PATENT DOCUMENTS 8,637,946 B2 * 1/2014 Saito ................. G11C 11/16
257/295
8,860,006 B2 * 10/2014 Wang .................. B82Y 10/00
257/295

(Continued)

OTHER PUBLICATIONS

Lin, et al., "Interfacial layer-free ZrO2 on Ge with 0.39-nm EOT, ?~43, ~2×10-3 A/cm2 gate leakage, SS =85 mV/dec, Ion /Ioff =6×105, and high strain response," Electron Devices Meeting (IEDM) Dec. 10-13, pp. 23.2.1-23.1.4.

(Continued)

*Primary Examiner* — Julio J Maldonado
*Assistant Examiner* — Andre' C Stevenson
(74) *Attorney, Agent, or Firm* — Slater Matsil, LLP

(57) ABSTRACT

An integrated circuit structure includes a semiconductor substrate, and a gate stack over the semiconductor substrate. The gate stack includes a high-k gate dielectric over the semiconductor substrate, and a magnetic compound over and in contact with the high-k gate dielectric. A source region and a drain region are on opposite sides of the gate stack. The gate stack, the source region, and the drain region are portions of a Metal-Oxide-Semiconductor (MOS) device.

20 Claims, 12 Drawing Sheets

(51) Int. Cl.
- *H01L 29/40* (2006.01)
- *H01L 29/51* (2006.01)
- *C23C 14/16* (2006.01)
- *H01L 21/28* (2006.01)
- *H01L 29/49* (2006.01)
- *H01L 29/66* (2006.01)
- *H01L 29/165* (2006.01)
- *H01L 27/088* (2006.01)

(52) U.S. Cl.
CPC ........ *H01L 29/517* (2013.01); *H01L 29/6659* (2013.01); *H01L 29/66545* (2013.01); *H01L 29/7834* (2013.01); *H01L 29/7848* (2013.01)

(56) References Cited

U.S. PATENT DOCUMENTS

| | | |
|---|---|---|
| 2009/0169874 A1 | 7/2009 | McCloskey et al. |
| 2010/0133092 A1* | 6/2010 | Mashimo .............. C23C 14/165 204/192.21 |
| 2012/0161261 A1 | 6/2012 | Garner et al. |
| 2016/0141334 A1 | 5/2016 | Takaki et al. |

OTHER PUBLICATIONS

Zhang, et al., "1-nm-thick EOT High Mobility Ge n- and p-MOSFETs with Ultrathin GeOx/Ge MOS Interfaces Fabricated by Plasma Post Oxidation," Electron Devices Meeting (IEDM) Dec. 5-7, 2011, pp. 28.3.1-28.3.4.

* cited by examiner

MOS DEVICES WITH ULTRA-HIGH DIELECTRIC CONSTANTS AND METHODS OF FORMING THE SAME

PRIORITY CLAIM AND CROSS-REFERENCE

This application is a divisional of U.S. patent application Ser. No. 14/245,785, entitled "Mos Devices with Ultra-High Dielectric Constants and Methods of Forming The Same," filed on Apr. 4, 2014, which application is incorporated herein by reference.

BACKGROUND

Metal Oxide-Semiconductor (MOS) devices are key components of integrated circuits. A MOS device includes a gate stack, which further includes a gate dielectric over a semiconductor substrate, and a gate electrode over the gate dielectric. A source region and a drain region are disposed on the opposite sides of the gate stack. The MOS device may be turned on and off by controlling the voltage applied on the gate electrode, so that the source region and the drain region are either electrically disconnected or electrically interconnected.

Conventionally, silicon dioxide was used to form the gate dielectrics. With the evolving of integrated circuits, dielectric materials with high dielectric constants (high-k values) are increasingly used to form the gate dielectrics. The high-k dielectrics may improve the short channel control of the MOS devices. The high-k dielectrics may also reduce gate leakage currents. Hafnium oxide and aluminum oxide are among known high-k dielectric materials.

It is desirable to have high-k materials with the k values higher than the currently used high-k dielectric materials in order to further improve the performance of the MOS devices. However, higher k values also result in problems. For example, with the further increase in the k values, the band-gaps of the high-k dielectric materials reduce, which results in the gate leakage currents of the respective MOS devices to be increased. Therefore, tradeoff has to be made to choose between higher k values accompanied by higher leakage currents and lower k-values accompanied by lower leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
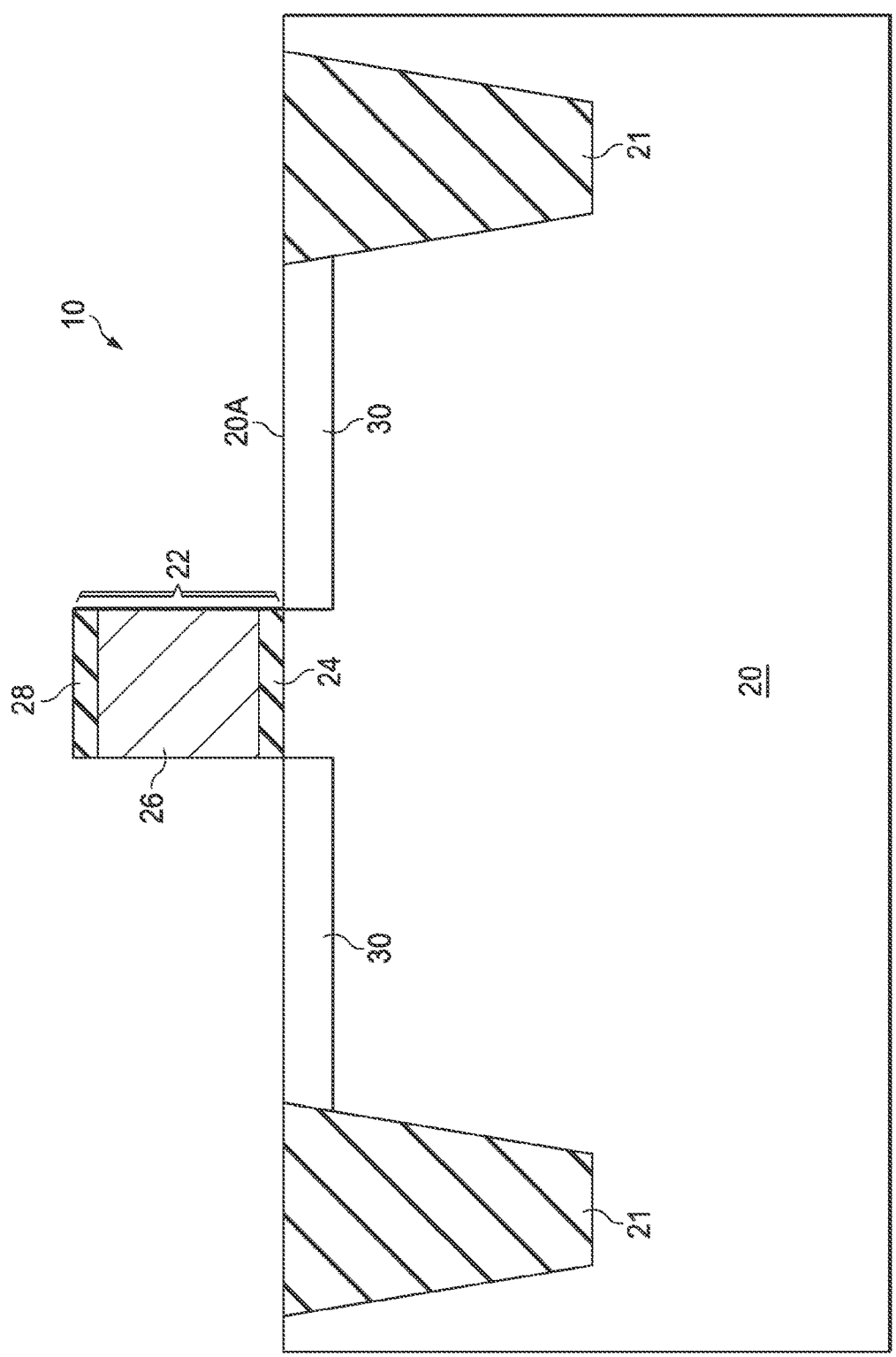
FIGS. 1 through 12 illustrate the cross-sectional views of intermediate stages in the formation of a Metal-Oxide-Semiconductor (MOS) device in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Metal-Oxide-Semiconductor (MOS) device and the method of forming the same are provided in accordance with various exemplary embodiments. The intermediate stages of forming the MOS device are illustrated. The variations of the embodiments are discussed. Throughout the various views and illustrative embodiments, like reference numbers are used to designate like elements. In the illustrated embodiments, a gate-last approach is used to form the replacement gate stack of the MOS device. It is appreciated that teaching regarding the materials and the formation methods of the gate stack is readily applicable to forming a MOS device using a gate-first approach, in which the gate stack is formed before the formation of source and drain regions of the MOS device.

FIGS. 1 through 12 are cross-sectional views of intermediate stages in the formation of a MOS device in accordance with some exemplary embodiments. Referring to FIG. 1, wafer 10, which includes substrate 20, is provided. Substrate 20 may be formed of a semiconductor material such as silicon, silicon carbon (SiC), silicon germanium (SiGe), a III-V compound semiconductor, or the like. Isolation regions such as Shallow Trench Isolation (STI) regions 21 are formed in substrate 20, and are used to define the active regions of MOS devices.

Dummy gate stack 22 is formed over substrate 20. Dummy gate stack 22 includes dummy gate dielectric 24 and dummy gate electrode 26. Dummy gate dielectric 24 includes silicon oxide in some exemplary embodiments. In alternative embodiments, other materials such as silicon nitride, silicon carbide, or the like, are also used. Dummy gate electrode 26 may include polysilicon. In some embodiments, dummy gate stacks 22 further includes hard mask 28 over dummy gate electrode 26. Hard mask 28 may comprise silicon nitride, for example, while other materials such as silicon carbide, silicon oxynitride, and the like may also be used. In alternative embodiments, hard mask 28 is not formed.

Figure 10:
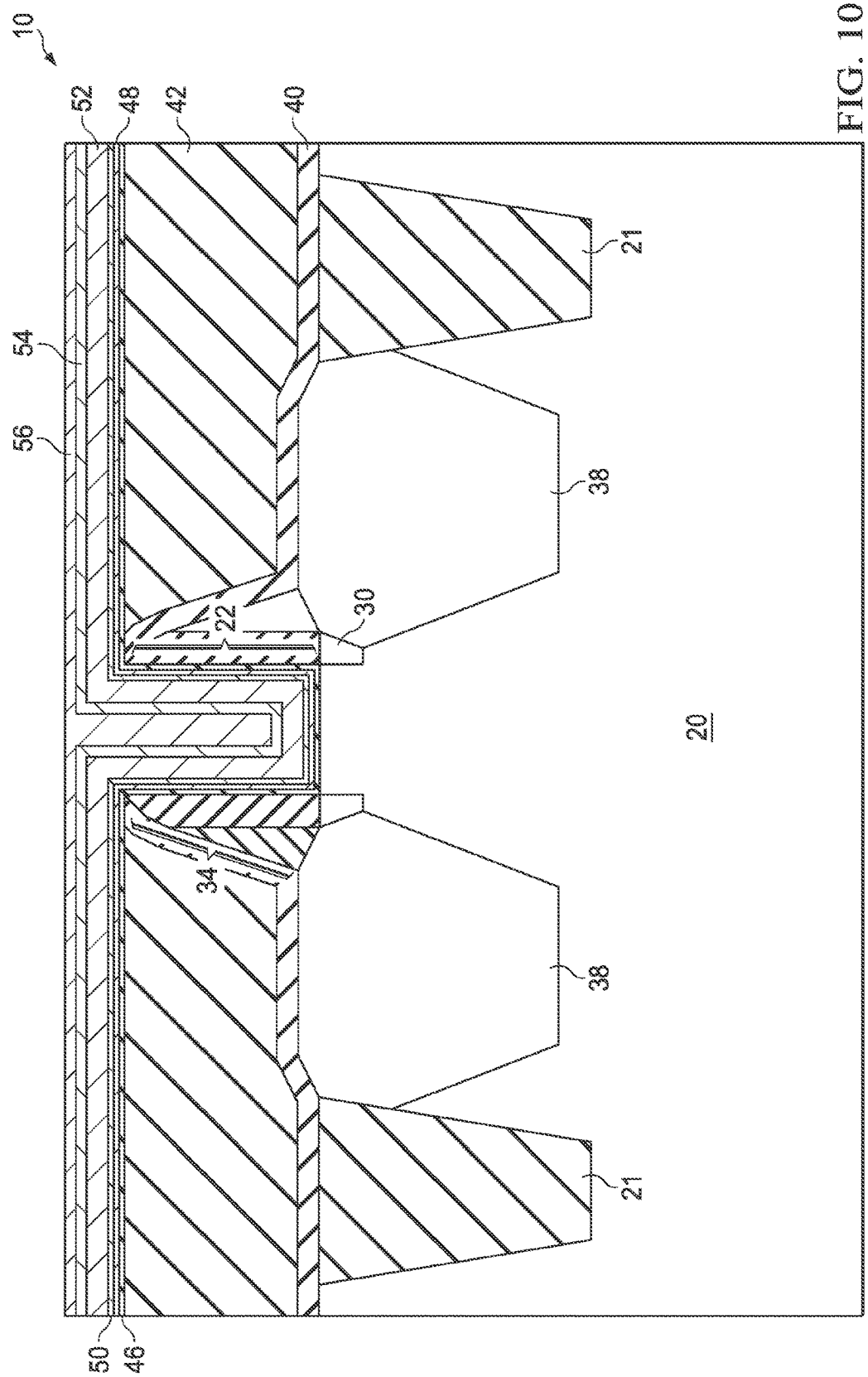

Lightly-Doped Drain/source (LDD) regions 30 are formed, for example, by implanting a p-type impurity (such as boron and/or indium) or an n-type impurity (such as phosphorous and/or arsenic) into substrate 20, depending on the conductivity type of the resulting MOS device 100 (FIG. 10). For example, when MOS device 100 is a pMOS device, LDD regions 30 are p-type regions. When the MOS device 100 is an nMOS device, LDD regions 30 are n-type regions.

Dummy gate stacks 22 acts as an implantation mask, so that the edges of LDD regions 30 are substantially aligned with the edges of gate stacks 22.

Figure 2:
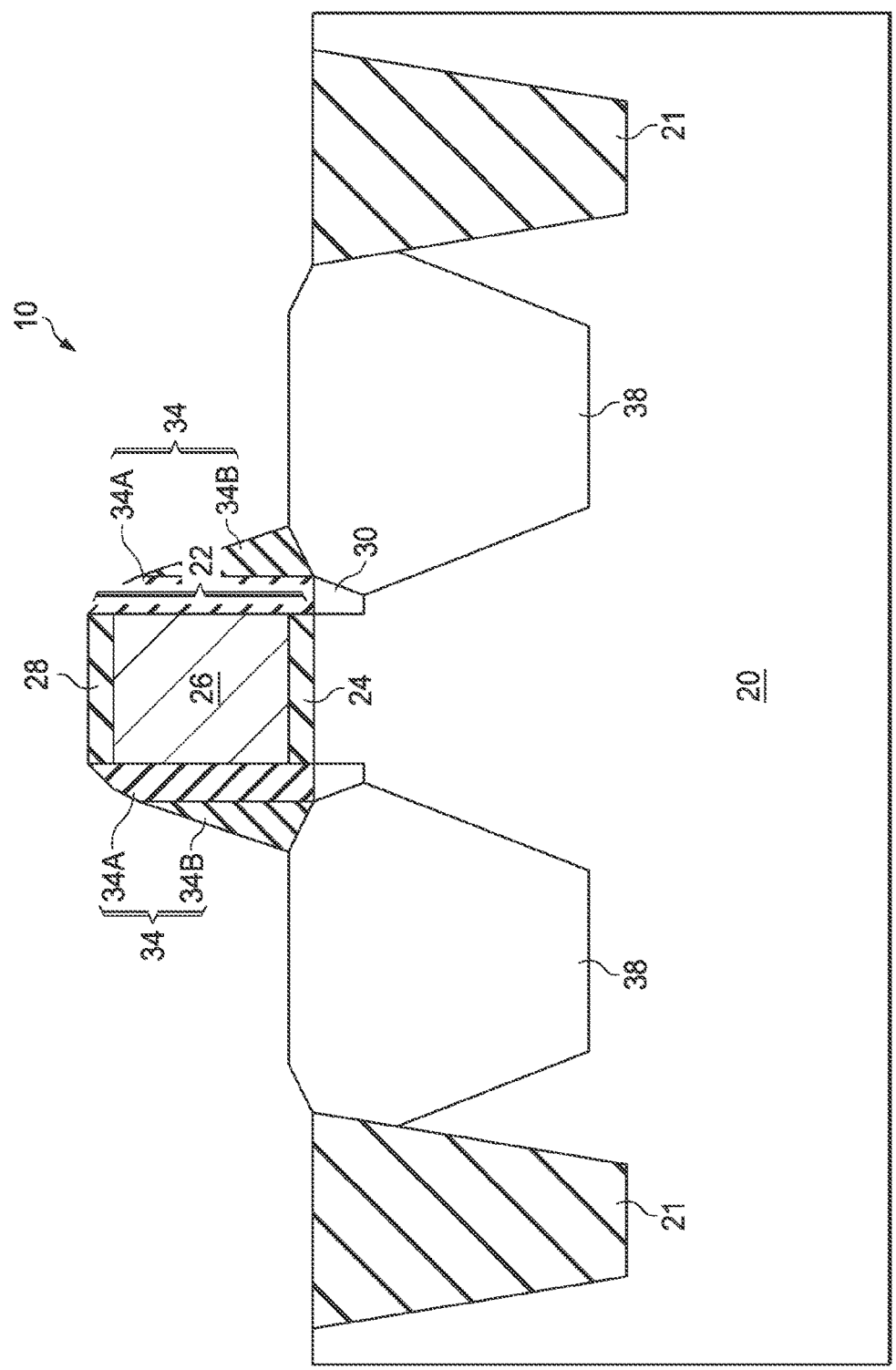

Referring to FIG. 2, gate spacers 34 are formed on the sidewalls of dummy gate stack 22. In some embodiments, each of gate spacers 34 includes silicon oxynitride layer 34A and silicon oxide layer 34B. In alternative embodiments, gate spacers 34 include one or more layers, each comprising silicon oxide, silicon nitride, silicon oxynitride, or other dielectric materials. The available formation methods include Plasma Enhanced Chemical Vapor Deposition (PECVD), Low-Pressure Chemical Vapor Deposition (LP-CVD), Sub-Atmospheric Chemical Vapor Deposition (SACVD), and other deposition methods.

Source and drain regions (referred to as source/drain regions hereinafter) 38 are formed in semiconductor substrate 20. In the embodiments wherein MOS device 100 (FIG. 10) is a pMOS device, source/drain regions 38 are of p-type. In the embodiments wherein MOS device 100 is an nMOS device, source/drain regions 38 are of n-type. In some embodiments, source/drain stressors (also marked as 38) are formed in semiconductor substrate 20. The source/drain stressors form at least parts of source and drain regions 38. FIG. 2 illustrates the embodiments in which source/drain regions 38 fully overlap the respective source/drain stressors. In alternative embodiments, source/drain regions 38 and the source/drain stressors are partially overlapped.

Furthermore, in the embodiments in which MOS device 100 (FIG. 10) is an nMOS device, source/drain stressors 38 may comprise silicon phosphorous (SiP), silicon carbon (SiC), or the like. In the embodiments in which MOS device 100 is a pMOS device, source/drain stressors 38 may comprise silicon germanium (SiGe). The formation of source/drain stressors 38 may be achieved by etching semiconductor substrate 20 to form recesses therein, and then performing an epitaxy to grow source/drain stressors 38 in the recesses.

Figure 3:
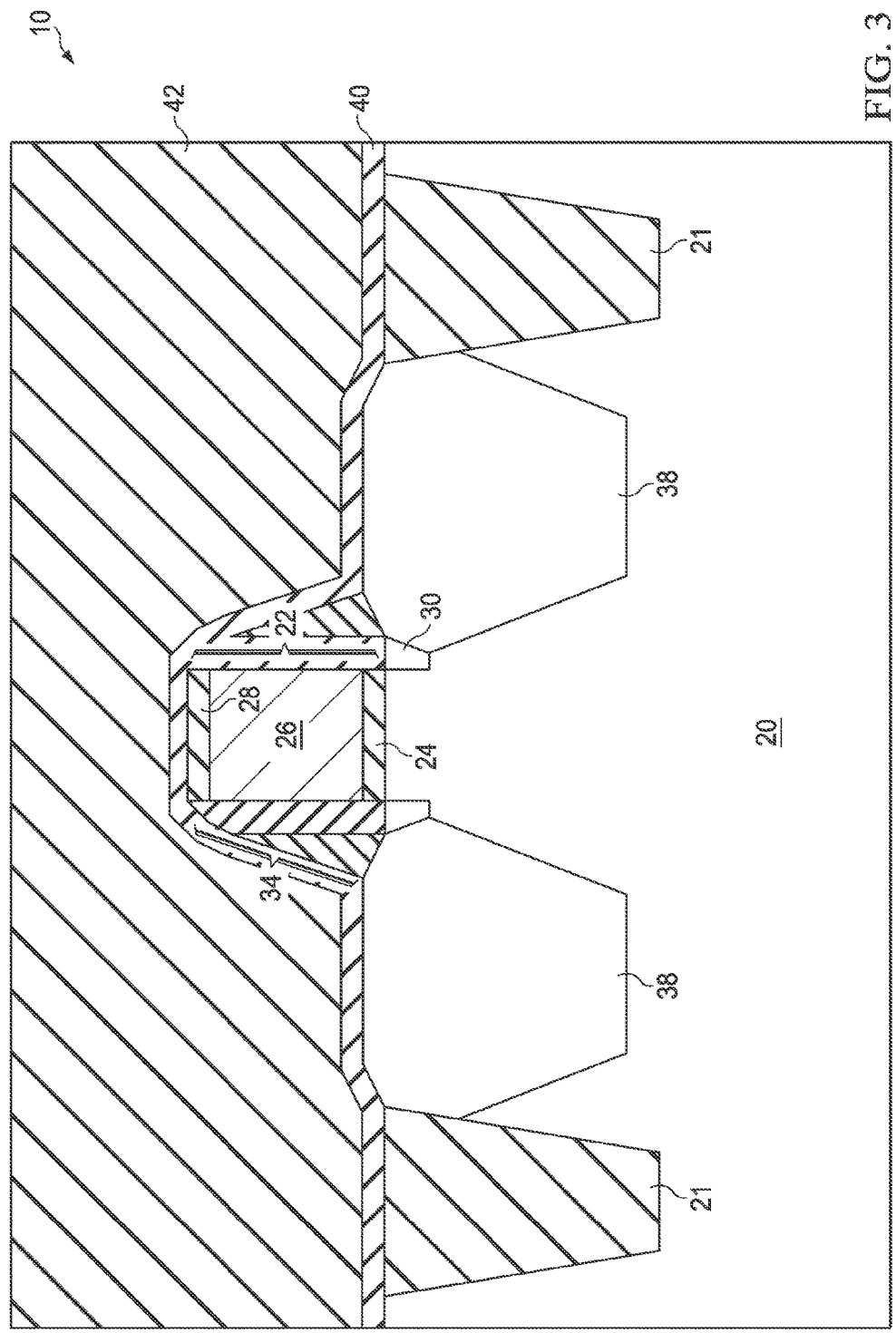

Referring to FIG. 3, Contact Etch Stop Layer (CESL) 40 is formed over gate stack 22 and source/drain regions 38. In some embodiments, CESL 40 comprises silicon nitride, silicon carbide, or other dielectric materials. Inter-Layer Dielectric (ILD) 42 is form over CESL 40. ILD 42 is blanket formed to a height higher than the top surface of dummy gate stack 22. ILD 42 may comprise Flowable oxide formed using, for example, Flowable Chemical Vapor Deposition (FCVD). ILD 42 may also be a spin-on glass formed using spin-on coating. For example, ILD 42 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 4:
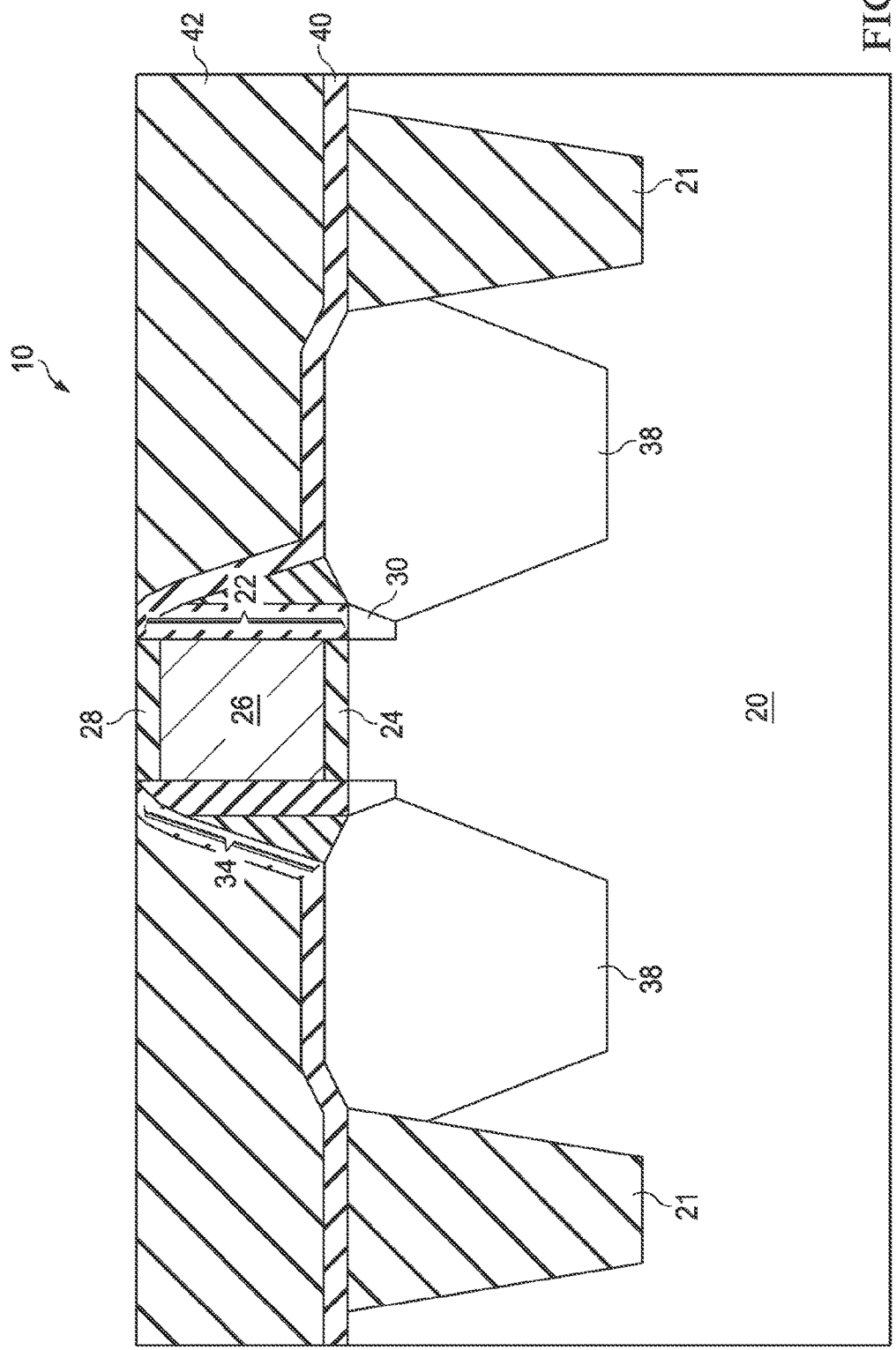

FIG. 4 illustrates a planarization step, which is performed using, for example, Chemical Mechanical Polish (CMP). The CMP is performed to remove excess portions of ILD 42 and CESL 40, wherein the excess portions are over the top surface of hard mask 28. Accordingly, dummy gate stack 22 is exposed. In alternative embodiments, hard mask 28 is removed during the CMP, wherein the CMP stops on the top surface of dummy gate electrode 26.

Figure 5:
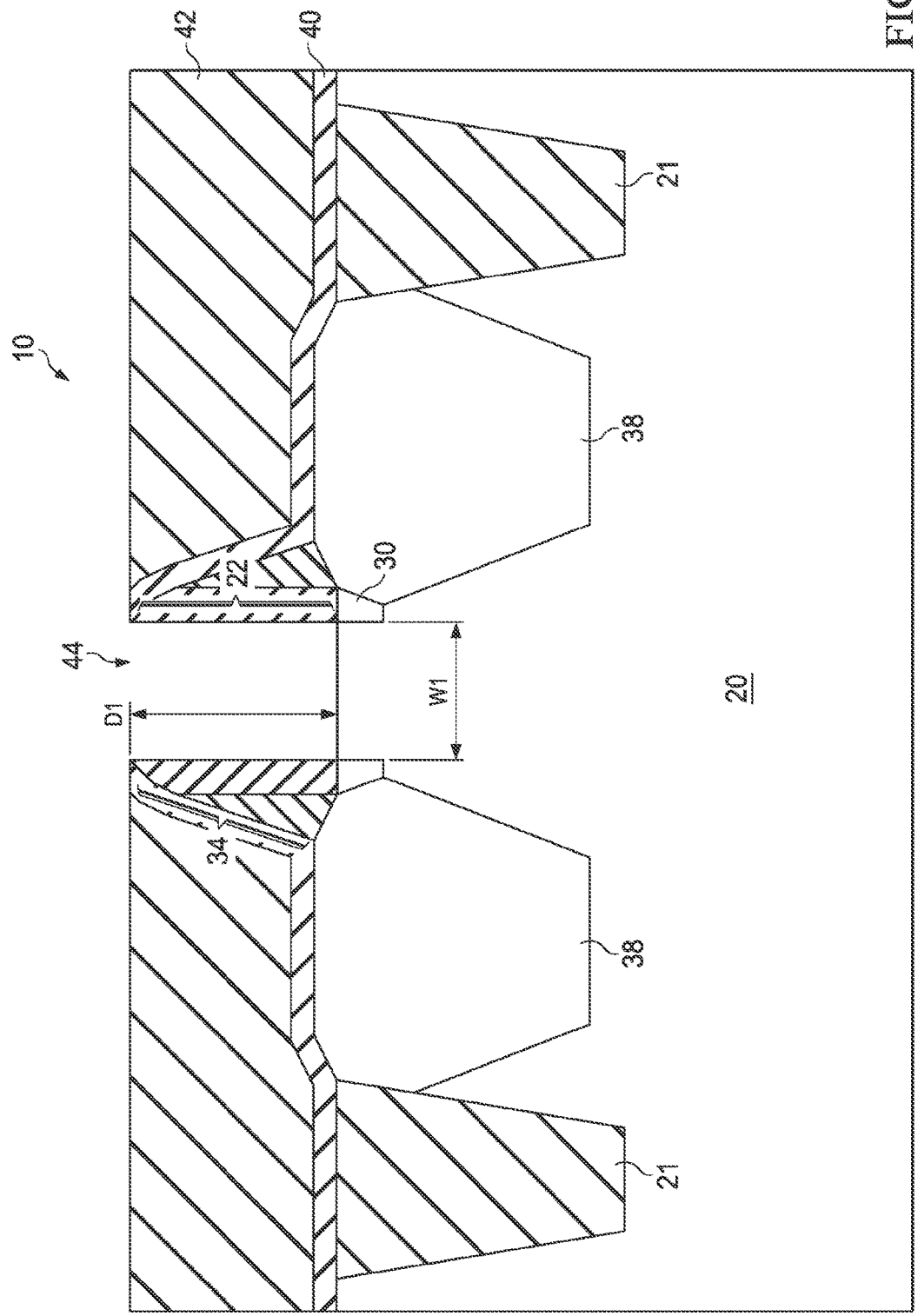

Next, dummy gate stack 22 is removed. Recess 44 is formed as a result of the removal of dummy gate stack 22, wherein the resulting structure is shown in FIG. 5. In some embodiment, the width W1 of recess 44 is smaller than about 25 nm, and may be in the range between about 18 nm and about 22 nm. It is appreciated, however, that the values recited throughout the description are merely examples, and may be changed to different values. Furthermore, depth D1 of recess 44 may be greater than about 10 nm. The aspect ratio D1/W1 of recess 44 may be higher than about 5, higher than about 7, or higher than about 10. Such high aspect ratio, small width W1, and great depth D1 demand the subsequently formed metal layers to be conformal in order to achieve the required performance.

Figure 6:
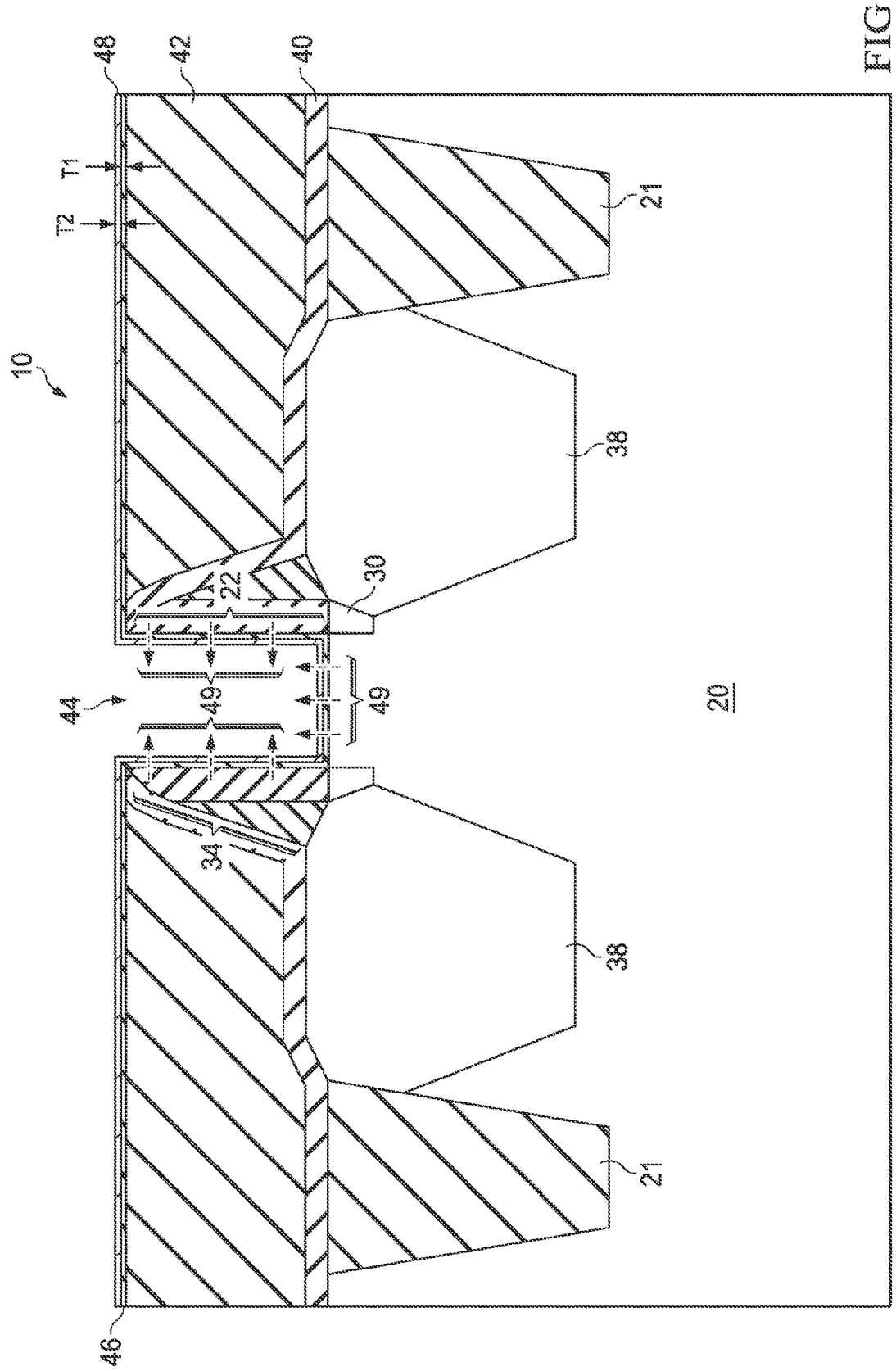
Figure 7:
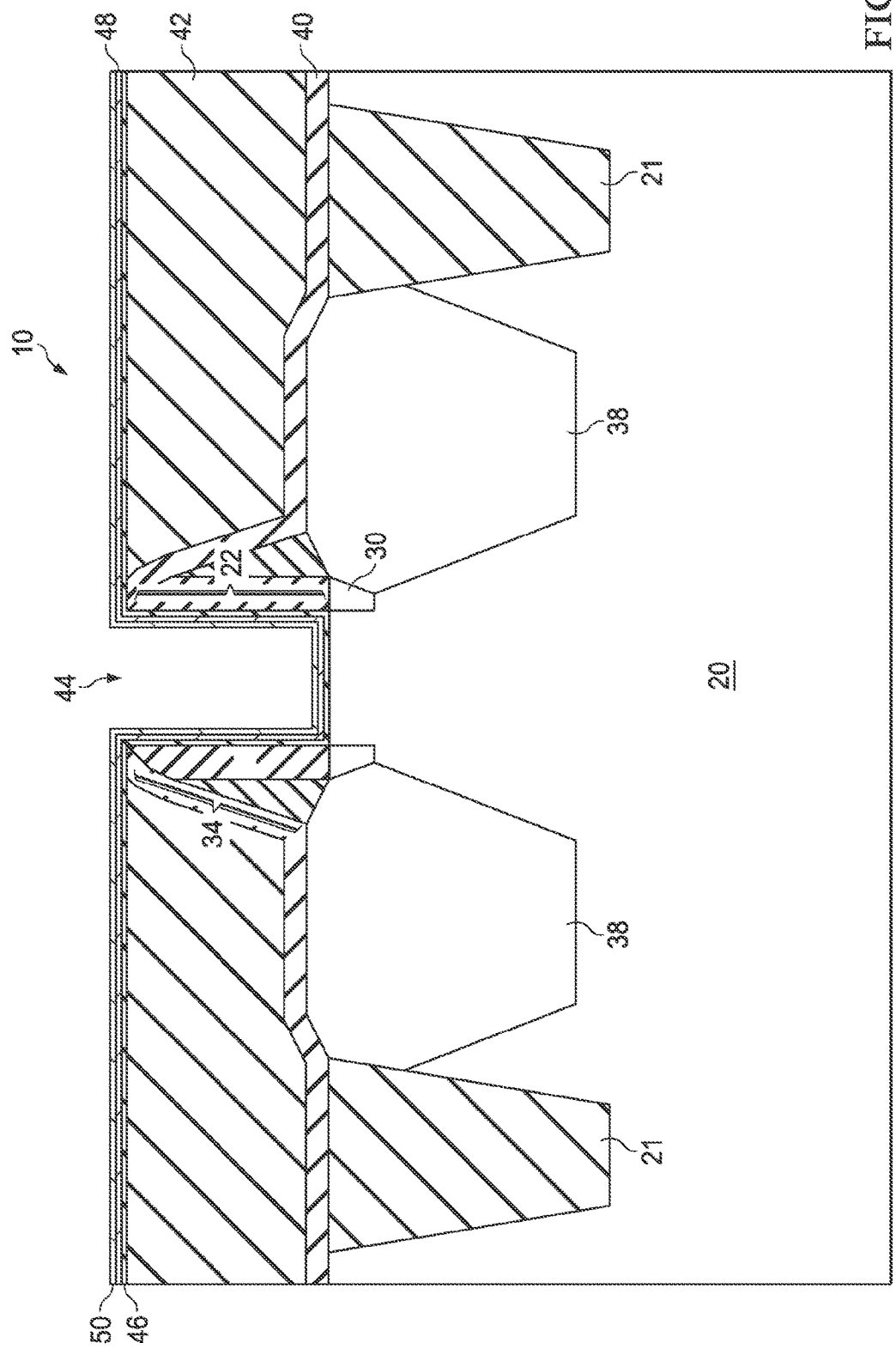

FIGS. 6 through 11 illustrate the formation of a replacement gate stack. Referring to FIG. 6, gate dielectric layer 46 is formed. In some embodiments, gate dielectric layer 46 may have a k value greater than 3.9, and hence is a high-k dielectric layer. The k value of high-k gate dielectric layer 46 may further be higher than about 20. In alternative embodiments, gate dielectric layer 46 may be a low-k dielectric layer having a k value lower than 3.9. In these embodiments, however, the k value of gate dielectric layer 46 will be propelled to be high-k by the overlying magnetic layer as shown in FIG. 7. In some embodiments, before the formation of high-k gate dielectric layer 46, an Interfacial Layer (IL, not shown) may be formed at the top surface of semiconductor substrate 20, wherein the IL layer is in recess 44. The IL layer may include an oxide layer such as a silicon oxide layer, which may be formed through the thermal oxidation of substrate 20, a chemical oxidation, or a deposition step.

In some embodiments, gate dielectric layer 46 is formed of a high-k dielectric material, which is formed of $BaTiO_3$, $CoFe_2O_4$, $YFeO_3$, $CdCr_2S_4$, $TbMnO_3$, $BiFeO_3$, or the like. In yet alternative embodiments, gate dielectric layer 46 is formed of $HfO_2$, $Al_2O_3$, or the like. In yet alternative embodiments, gate dielectric layer 46 is formed of a low-k dielectric material such as $HgCr_2S_4$, which has a k value lower than 1 (such as about 0.54). The thickness T1 of gate dielectric layer 46 is preferably small, for example, smaller than about 10 Å. In some embodiments, thickness T1 is in the range between about 5 Å and about 10 Å. The formation of gate dielectric layer 46 may be performed using, for example, Atomic Layer Deposition (ALD). Other methods may also be used. Gate dielectric layer 46 may have a high k value. For example, $BaTiO_3$ may have a k value equal to about 300.

As also shown in FIG. 6, magnetic layer 48 is formed over, and may or may not be in contact with, gate dielectric layer 46. Magnetic layer 48 may be formed of a magnetic compound, which generates magnetic field 49. Magnetic layer 48 may be electrically conductive. In some embodiments, magnetic material 48 comprises iron (Fe) and platinum (Pt). The formation process and the composition of magnetic material 48 are adjusted to increase the magnetic field generated by magnetic material 48. FIG. 6 schematically illustrates the magnetic fields (represented by arrows 49) that are generated by magnetic layer 48. Magnetic fields 49 have directions perpendicular to the major surface planes of magnetic layer 48. For example, the bottom portion of magnetic layer 48, with the bottom portion extending horizontally, generates a magnetic field 49 penetrating through the underlying horizontal portion of gate dielectric layer 46, wherein the respective magnetic field 49 is in the vertical direction. The respective magnetic field 49 is also perpendicular to a major top surface 20A (FIG. 1) or bottom surface of substrate 20.

On the other hand, the sidewall portions of magnetic layer 48, which extend vertically, generate magnetic fields 49 penetrating through the respective contacting portions of gate dielectric layer 46, wherein the respective portions of magnetic fields 49 are in the horizontal directions in FIG. 6. In the embodiments in which $BaTiO_3$ is used, the magnetic field 49 may have directions as illustrated. In alternative embodiments in which different magnetic materials are used, the magnetic field 49 may have directions opposite to the illustrated directions.

In some embodiments, magnetic layer 48 has a thickness T2 in the range between about 10 nm and about 500 nm. Thickness T2 may also be in the range between about 100 nm and about 300 nm. The formation of magnetic layer 48 may be performed using, for example, sputtering (Physical Vapor Deposition (PVD)). The formation conditions affect the magnitude of the magnetic field 49, and without the proper formation conditions, magnetic field may not be generated. In some embodiments, to induce and increase magnetic field 49, the chamber for forming magnetic layer 48 may have a pressure lower than about $10^{-7}$ torr. The formation temperature is higher than about 500° C. After the formation, a post-anneal is performed on wafer 10, with the temperature being higher than about 1,000° C. The optimum conditions for inducing and increasing magnetic field 49 are affected by various factors, and may be found through experiments.

In some embodiments, magnetic layer 48 is formed of (or comprises) FePt. An exemplary atomic percentage of Pt in FePt is in the range between about 20 percent and about 80 percent, and the atomic percentage of Fe in FePt is in the range between about 80 percent and about 20 percent accordingly. Experiment results indicated that when the atomic percent of Fe and the atomic percent of Pt are close to each other, the magnetic field 49 generated by magnetic layer 48 is high. In some exemplary embodiments, an atomic percentage of Pt in FePt is in the range between about 40 percent and about 60 percent, and the atomic percentage of Fe in FePt is in the range between about 60 percent and about 40 percent accordingly. In alternative embodiments, magnetic layer 48 comprises NiFe, wherein the atomic percentage of Fe in NiFe is in the range between about 20 percent and about 80 percent, and the atomic percentage of Ni in NiFe is in the range between about 80 percent and about 20 percent accordingly.

By adjusting the formation process conditions and the composition of magnetic layer 48 in combination, magnetic field 49 may be higher than about 0.1 Tesla, which is applied on gate dielectric layer 46. The dipoles in gate dielectric layer 46 are affected by magnetic field 49, and are more oriented in the direction parallel to (or anti-parallel to) the direction of magnetic field 49 than if no magnetic field 49 is applied. The dipoles may be induced when the respective MOS device is applied with voltages. This results in the capacitance that is caused by gate dielectric layer 46 to be increased. This is equivalent to that the effective k value of gate dielectric layer 46 is increased. In some embodiments, depending on the materials of gate dielectric layer 46 and magnetic layer 48, and the formation processes, the effective k value of gate dielectric layer 46 may be increased by between about 10 percent and about 10,000 percent (100 times). For example, when gate dielectric layer 46 is formed of $BaTiO_3$, and magnetic layer 48 is formed of FePt, the effective k-value of gate dielectric layer 46 may be increased by about 3 times, and the effective k value of gate dielectric layer 46 may be about 1,250 to about 10,000. On the other hand, when gate dielectric layer 46 is formed of $HgCr_2S_4$, and magnetic layer 48 is formed of FePt, the effective k-value of gate dielectric layer 46 may be increased by about 120 times, and the effective k-value may be about 65.

Next, as shown in FIG. 7, diffusion barrier layer 50 is formed over magnetic layer 48. In some embodiments, diffusion barrier layer 50 includes TiN, TaN, or composite layers thereof. For example, diffusion barrier layer 50 may include a TiN layer (the lower part of diffusion barrier layer 50), and a TaN layer (the upper part of diffusion barrier layer 50) over the TiN layer.

Figure 8:
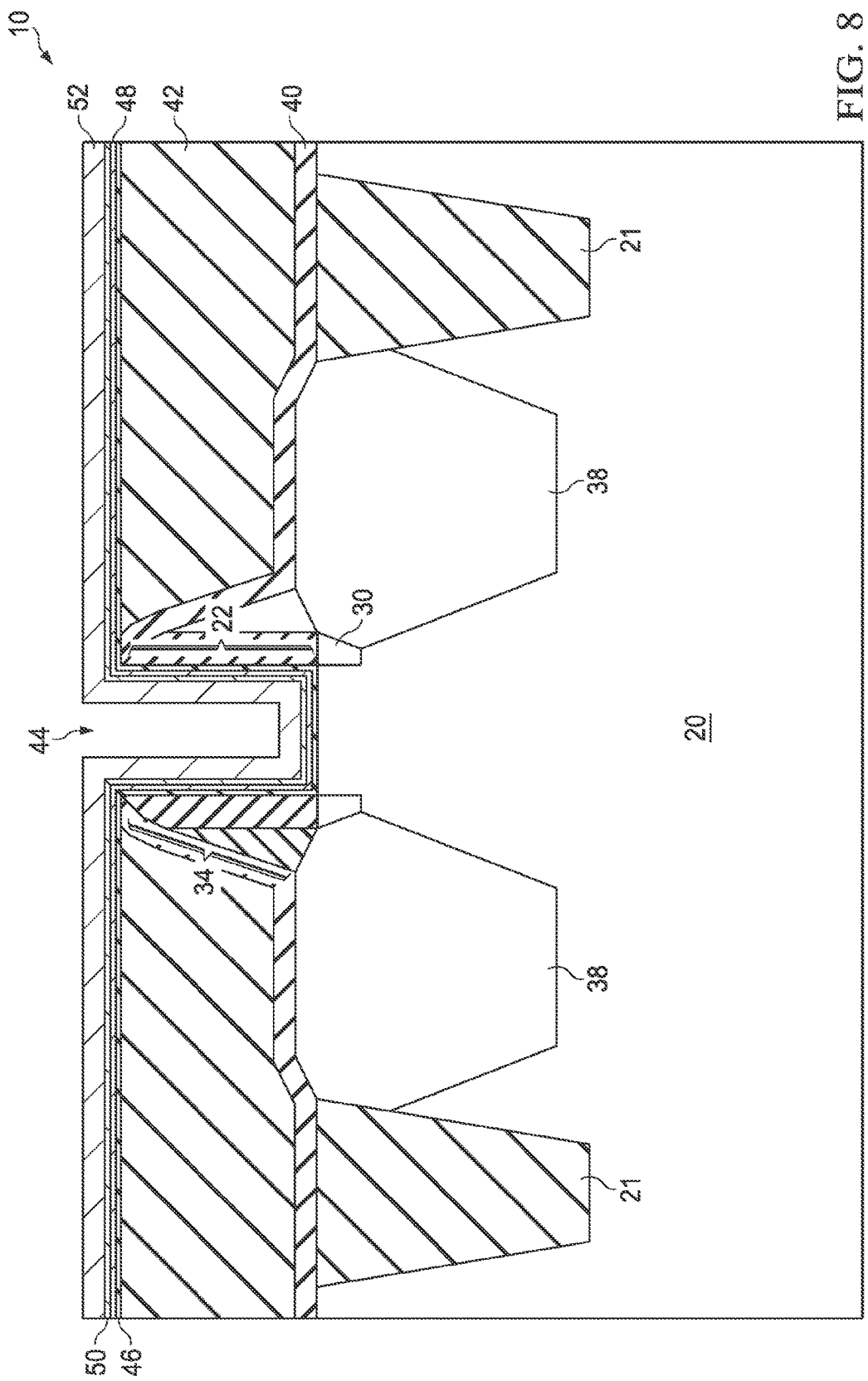

Referring to FIG. 8, metal layer 52 is formed. In the embodiments in which the resulting MOS device 100 (FIG. 12) is an N-type MOS (NMOS) device, metal layer 52 is in contact with diffusion barrier layer 50. For example, in the embodiments in which diffusion barrier layer 50 comprises a TiN layer and a TaN layer, metal layer 52 may be in physical contact with the TaN layer. Metal layer 52 provides the work function suitable for NMOS devices, which work function is lower than the mid-gap work function. The work function lower than the mid-gap work function is referred to as an n-work function, and the respective metal having the n-work function is referred to as an n-metal. In some embodiments, metal layer 52 is an n-metal having a work function lower than about 4.4 eV. The work function of metal layer 52 may also be in the range between about 4.1 eV and about 4.4 eV. Metal layer 52 may comprise titanium aluminum (TiAl) (which may include, or free from or substantially free from other elements) in accordance with some embodiments. The formation of metal layer 52 may be achieved through Physical Vapor Deposition (PVD).

In alternative embodiments in which the resulting MOS device 100 (FIG. 12) is a P-type MOS (PMOS) device, an additional TiN layer (not shown) is formed between, and in contact with, the TaN layer (in diffusion barrier layer 50) and the overlaying metal layer 52. The additional TiN layer provides the work function suitable for PMOS devices, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

Figure 9:
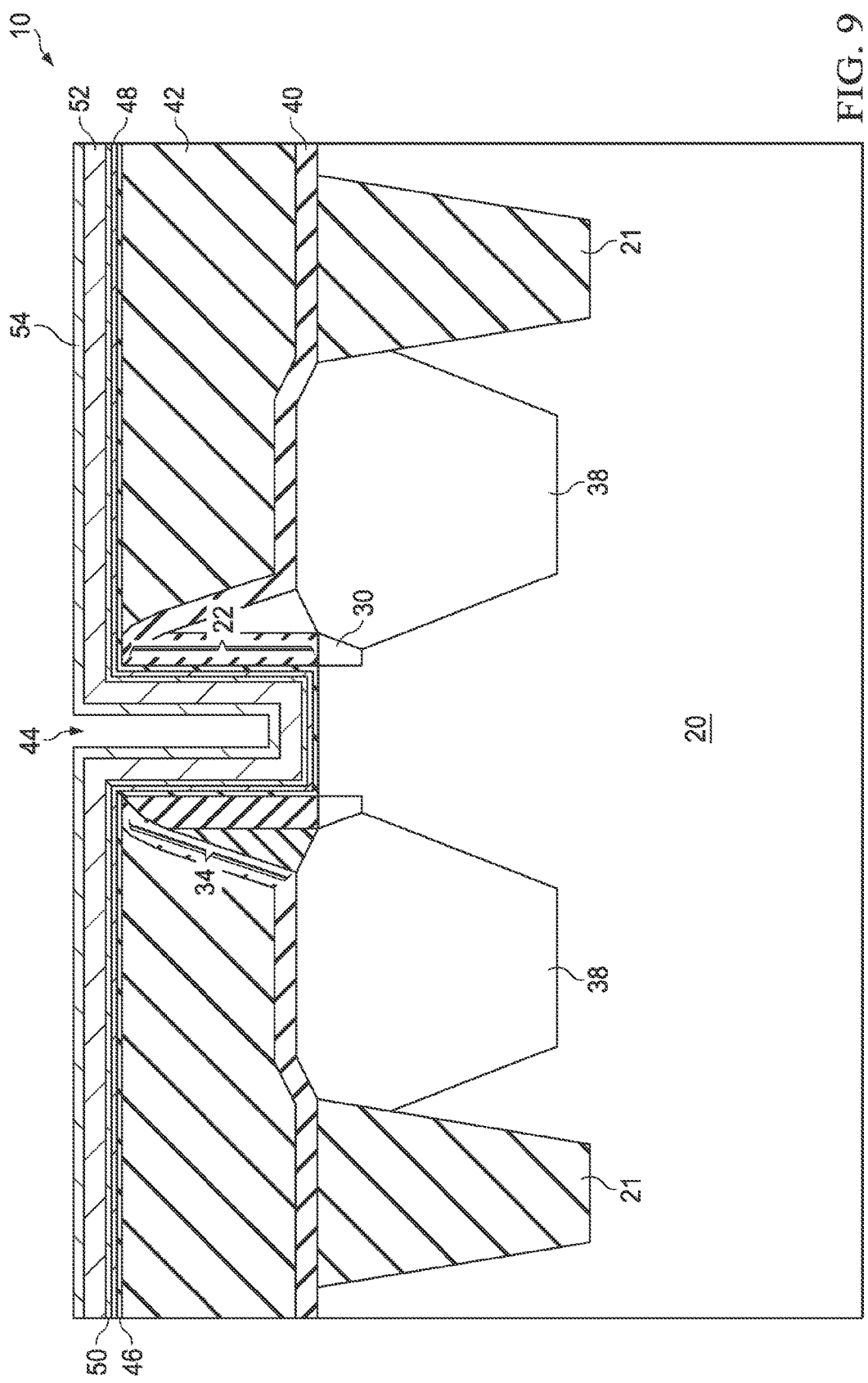

Next, as shown in FIG. 9, layer(s) 54 are formed. In some embodiments, layers 54 include a block layer, which may comprise TiN in some embodiments. Block layer 52 may be formed using Chemical Vapor Deposition (CVD). Layers 54 may also include a wetting layer, which has a good ability to adhere (and wet) the subsequently formed filling metal 56 (FIG. 12) during the reflow of filling metal 56. In some embodiments, the wetting layer is a cobalt layer, which may be formed using CVD.

FIG. 10 illustrates the formation of filling metal 56 to fill the remaining portions of recess 44 (FIG. 9). Filling metal 56 may comprise aluminum or an aluminum alloy, which may also be formed using PVD, CVD, or the like. Filling metal 56 may be reflowed to fully fill the remaining recess 44 as in FIG. 9. The formation of wetting layer 54 improves the wetting of filling metal 56 to the underlying layers.

Figure 11:
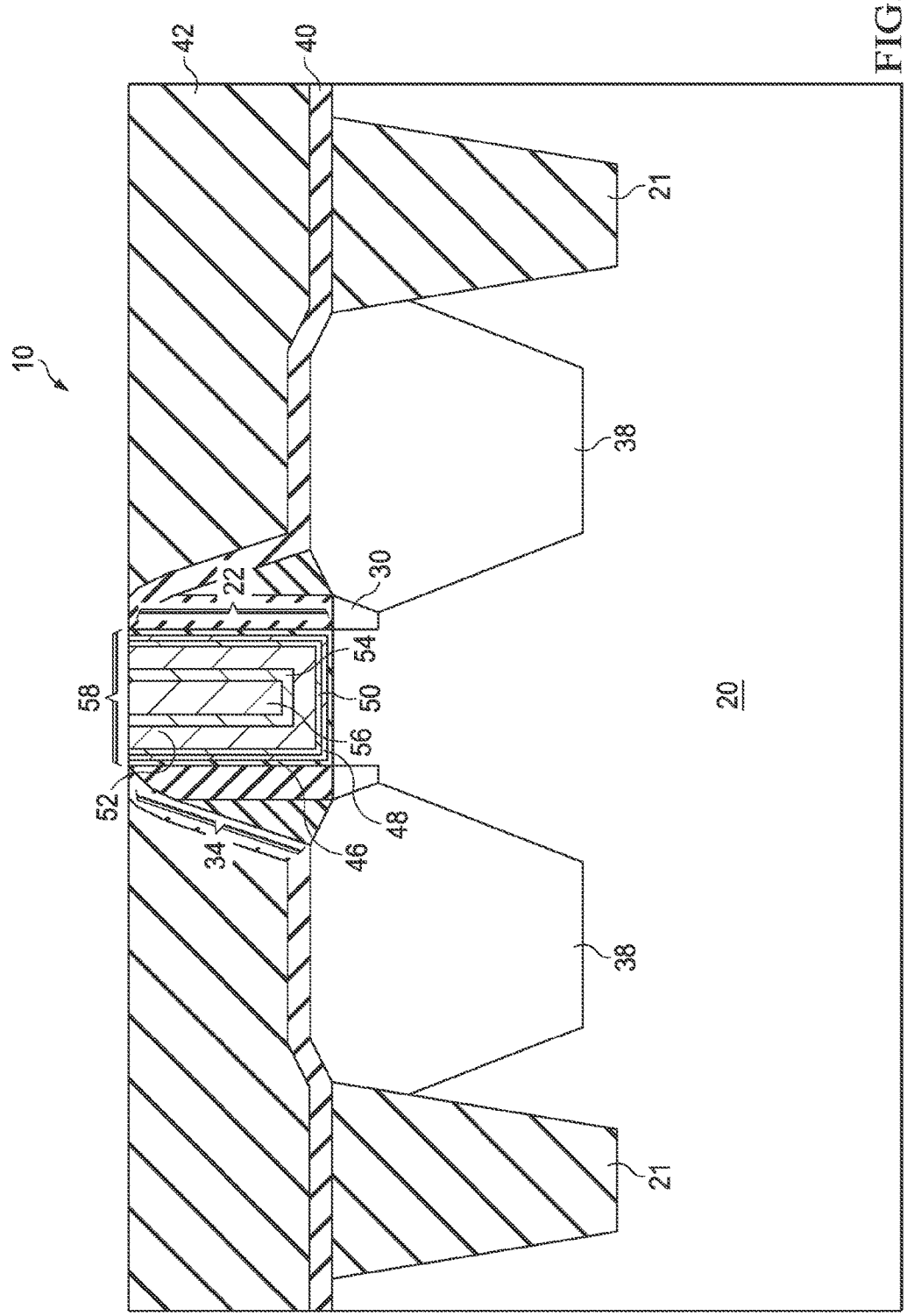

FIG. 11 illustrates a planarization step (for example, a CMP) for removing excess portions of layers 46, 48, 50, 52, 54, and 56, wherein the excess portions are over ILD 42. The remaining portions of layers 46, 48, 50, 52, 54, and 56 form replacement gate stack 58. Each of the remaining portions of layers 46, 48, 50, 52, 54, and 56 may include a bottom portion, and sidewall portions over and connected to the bottom portion.

Figure 12:
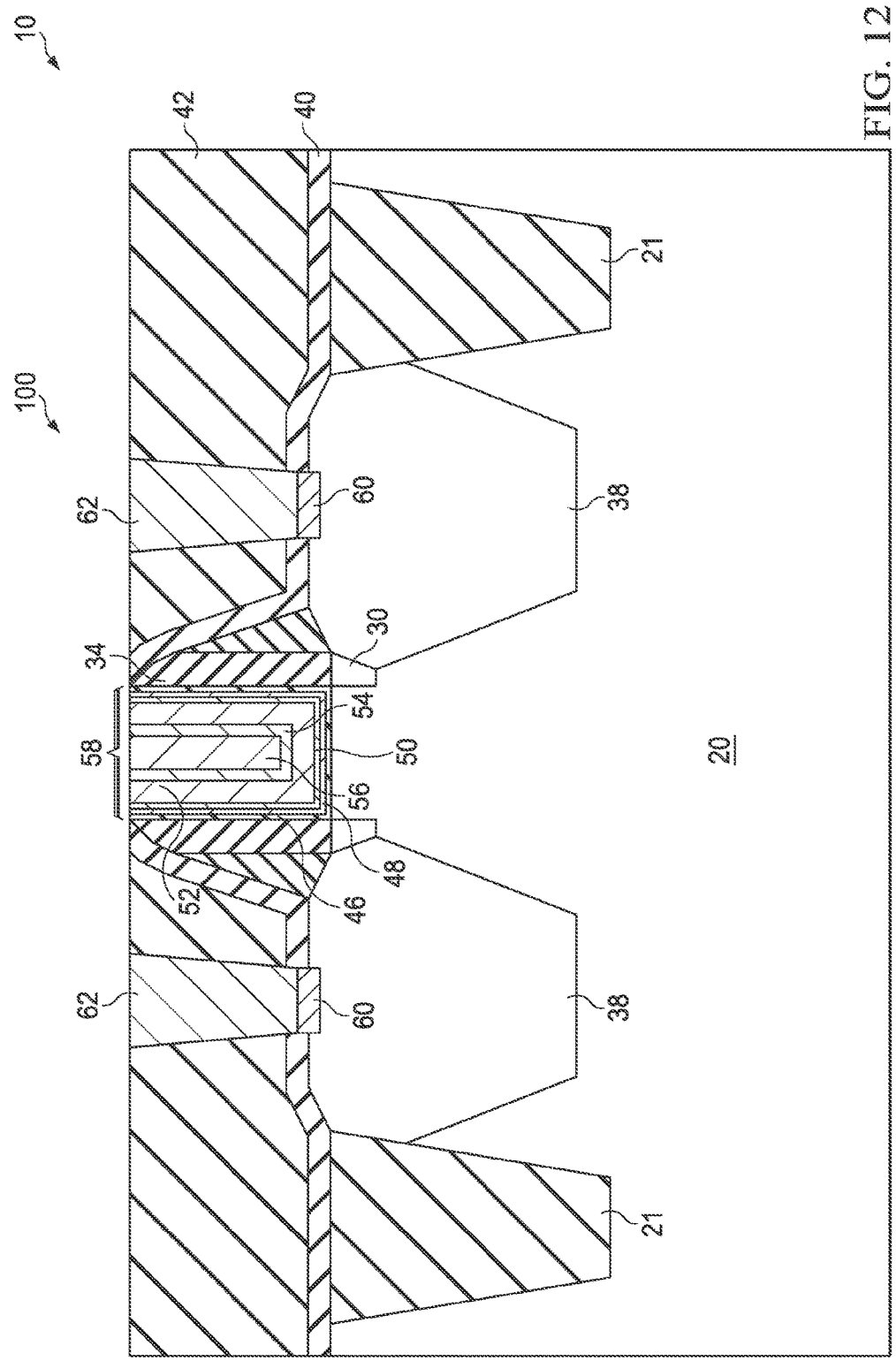

Referring to FIG. 12, source/drain silicide regions 60 and contact plugs 62 are formed. The formation process may include forming contact plug openings in ILD 42 to expose source/drain regions 38, forming a metal layer (not shown) to extend into the contact plug openings, performing an annealing to form the source/drain silicide regions 60, removing the un-reacted portions of the metal layer, and filling the contact plug openings to form contact plugs 62. MOS device 100 is thus formed.

When the gate-first approach is used, the structure of MOS device 100 is similar to what is shown in FIG. 12, except that that the layers, such as 46, 48, 50, 52, 54, and 56, in gate stack 58 are horizontal without including the vertical portions. One of ordinary skill in the art will realize the formation details of the respective MOS device by applying the teaching of the present disclosure.

The embodiments of the present disclosure have some advantageous features. By forming a magnetic layer over the high-k dielectric layer, the effective k value of the high-k dielectric layer, affected by the magnetic field, is increased. On the other hand, the increase in the k value of the high-k dielectric layer does not result in the reduction in the bandgap of the high-k dielectric layer. Accordingly, the gate leakage current is not increased.

In accordance with some embodiments of the present disclosure, a MOS device includes a semiconductor substrate, a gate dielectric over the semiconductor substrate, and a magnetic layer over the gate dielectric.

In accordance with alternative embodiments of the present disclosure, an integrated circuit structure includes a semiconductor substrate, and a gate stack over the semiconductor substrate. The gate stack includes a high-k gate dielectric over the semiconductor substrate, and a magnetic compound over and in contact with the high-k gate dielectric. A source region and a drain region are on opposite sides of the gate stack. The gate stack, the source region, and the drain region are portions of a MOS device.

In accordance with yet alternative embodiments of the present disclosure, a method includes forming a gate stack over a semiconductor substrate. The formation of the gate stack includes forming a high-k gate dielectric over the semiconductor substrate, and forming a magnetic compound over the high-k gate dielectric. A source region and a drain region are formed on opposite sides of the gate stack, wherein the gate stack, the source region, and the drain region are portions of a MOS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack over a semiconductor substrate, wherein the forming the gate stack comprises:
        forming a high-k gate dielectric over the semiconductor substrate; and
        forming a magnetic compound over the high-k gate dielectric, wherein the forming the magnetic compound comprises:
            depositing the magnetic compound using sputtering, wherein the sputtering is performed at a temperature higher than about 500° C.; and
            after the sputtering, performing an annealing on the magnetic compound at a temperature higher than about 1,000° C.; and
    forming a source region and a drain region on opposite sides of the gate stack, wherein the gate stack, the source region, and the drain region are portions of a Metal-Oxide-Semiconductor (MOS) device.

2. The method of claim 1, wherein the high-k gate dielectric is in contact with the magnetic compound, and wherein a magnetic field generated by the magnetic compound penetrates through, and is perpendicular to, a major surface plane of the high-k gate dielectric.

3. The method of claim 2, wherein the magnetic field is in a direction point from the magnetic compound to the high-k gate dielectric.

4. The method of claim 2, wherein the magnetic field is in a direction point from the high-k gate dielectric to the magnetic compound.

5. The method of claim 1, wherein the forming the high-k gate dielectric comprises forming a layer comprising $BaTiO_3$, $CoFe_2O_4$, $YFeO_3$, $CdCr_2S_4$, $HgCr_2S_4$, $TbMnO_3$, or $BiFeO_3$.

6. The method of claim 1, wherein the depositing the magnetic compound comprises depositing a FePt layer.

7. The method of claim 1, wherein the forming the magnetic compound comprises depositing a NiFe layer.

8. A method comprising:
    removing a dummy gate between gate spacers to form an opening;
    forming a gate dielectric extending into the opening;
    depositing a magnetic layer over the gate dielectric and extending into the opening;
    depositing a work function layer over the magnetic layer;
    filling a remaining portion of the opening with a metallic material;
    performing a planarization to remove excess portions of the gate dielectric, the magnetic layer, the work function layer, and the metallic material to form a replacement gate; and
    forming a source/drain region adjacent to the replacement gate.

9. The method of claim 8, wherein a magnetic field applied on the gate dielectric by the magnetic layer is higher than about 0.1 Tesla.

10. The method of claim 8, wherein the magnetic layer is deposited using physical vapor deposition.

11. The method of claim 8, wherein the depositing the magnetic layer comprises depositing a FePt layer or a NiFe layer.

12. The method of claim 11, wherein the depositing the magnetic layer comprises depositing the FePt layer, and each of platinum and iron in the FePt layer has an atomic percentage between about 40 percent and about 60 percent.

13. The method of claim 8, wherein the depositing the magnetic layer is performed using sputtering, and the method further comprises, after the sputtering, performing an annealing on the magnetic layer at a temperature higher than about 1,000° C.

14. A method comprising:
    depositing a gate dielectric comprising a portion over and contacting a semiconductor region;
    depositing a magnetic layer over the gate dielectric, wherein the magnetic layer comprises FePt;
    annealing the magnetic layer;
    after the annealing, depositing a diffusion barrier layer over the magnetic layer;
    depositing a metal-containing layer over the diffusion barrier layer; and
    forming a source/drain region adjacent to the gate dielectric.

15. The method of claim 14, wherein the annealing is performed at a temperature higher than about 1,000° C.

16. The method of claim 14, wherein the depositing the diffusion barrier layer comprises depositing a metal nitride layer.

17. The method of claim 14, wherein the diffusion barrier layer is in physical contact with the magnetic layer.

18. The method of claim 14, wherein each of platinum and iron in the magnetic layer has an atomic percentage between about 40 percent and about 60 percent.

19. The method of claim 14, wherein the magnetic layer is deposited at a temperature higher than about 500° C.

20. The method of claim 7, wherein the FePt layer is deposited to have a platinum (Pt) atomic percentage in a range between about 40 percent and about 60 percent, and an iron (Fe) atomic percentage in a range between about 60 percent and about 40 percent.

* * * * *